United States Patent
Lee

(10) Patent No.: US 12,520,505 B2
(45) Date of Patent: Jan. 6, 2026

(54) SEMICONDUCTOR DEVICES AND PREPARATION METHODS THEREFOR

(71) Applicant: WUHAN XINXIN SEMICONDUCTOR MANUFACTURING CO., LTD., Hubei (CN)

(72) Inventor: Eunseok Lee, Hubei (CN)

(73) Assignee: WUHAN XINXIN SEMICONDUCTOR MANUFACTURING CO., LTD., Hubei (CN)

( * ) Notice: Subject to any disclaimer, the term of this patent is extended or adjusted under 35 U.S.C. 154(b) by 427 days.

(21) Appl. No.: 18/256,933

(22) PCT Filed: Dec. 22, 2020

(86) PCT No.: PCT/CN2020/138230
§ 371 (c)(1),
(2) Date: Jun. 12, 2023

(87) PCT Pub. No.: WO2022/126686
PCT Pub. Date: Jun. 23, 2022

(65) Prior Publication Data
US 2024/0040807 A1    Feb. 1, 2024

(30) Foreign Application Priority Data
Dec. 14, 2020  (CN) .......................... 202011474913.9

(51) Int. Cl.
  *H01L 25/065*  (2023.01)
  *H01L 23/00*  (2006.01)
  (Continued)

(52) U.S. Cl.
  CPC ............. *H10B 80/00* (2023.02); *H01L 24/08* (2013.01); *H01L 24/80* (2013.01);
  (Continued)

(58) Field of Classification Search
  CPC ........ H10B 80/00; H10B 41/40; H10B 43/40; H10B 69/00; H10B 41/10; H10B 43/10;
  (Continued)

(56) References Cited

U.S. PATENT DOCUMENTS

2007/0047284 A1   3/2007  Silvestri
2008/0130395 A1   6/2008  Silvestri
(Continued)

FOREIGN PATENT DOCUMENTS

| CN | 101253568 B | 10/2010 |
| CN | 104716139 A | 6/2015 |
| WO | 2020157558 A1 | 8/2020 |

OTHER PUBLICATIONS

International Search Report in International application No. PCT/CN2020/138230, mailed on Dec. 22, 2020.
(Continued)

*Primary Examiner* — Thanh Y. Tran
(74) *Attorney, Agent, or Firm* — Nathan & Associates Patent Agents Ltd.; Menachem Nathan

(57) ABSTRACT

The present disclosure provides a semiconductor device and a manufacturing method thereof. The semiconductor device includes stacked first and second chips, a local word line decoder and a local bit line decoder for controlling an array block are disposed in the second chip, and the first chip forms an electrical connection with the second chip. At least one of the local word line decoder block and the local bit line decoder block formed by the local word line decoder block and the local bit line decoder block respectively is arranged within the top-down projection region of the array block in the second chip.

20 Claims, 4 Drawing Sheets

(51) Int. Cl.
    *H01L 25/00*     (2006.01)
    *H01L 25/18*     (2023.01)
    *H10B 80/00*     (2023.01)

(52) U.S. Cl.
    CPC .......... *H01L 25/0657* (2013.01); *H01L 25/18* (2013.01); *H01L 25/50* (2013.01); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
    CPC ..... H01L 24/08; H01L 24/80; H01L 25/0657; H01L 25/18; H01L 25/50; H01L 2224/08145; H01L 2224/80895; H01L 2224/80896; H01L 2924/1431; H01L 2924/14511; G11C 5/025; G11C 8/08; G11C 8/10
    See application file for complete search history.

(56) References Cited

U.S. PATENT DOCUMENTS

| | | |
|---|---|---|
| 2009/0289701 A1 | 11/2009 | Silvestri |
| 2011/0156027 A1 | 6/2011 | Yamazaki et al. |
| 2011/0220987 A1 | 9/2011 | Tanaka et al. |
| 2012/0063208 A1 | 3/2012 | Koyama et al. |
| 2012/0176192 A1 | 7/2012 | Silvestri |
| 2013/0256657 A1 | 10/2013 | Yamazaki et al. |
| 2016/0163374 A1 | 6/2016 | Jun et al. |
| 2016/0260718 A1 | 9/2016 | Yamazaki et al. |
| 2018/0286484 A1 | 10/2018 | Tanzawa |
| 2018/0286864 A1 | 10/2018 | Yamazaki et al. |
| 2019/0221557 A1* | 7/2019 | Kim ........................ H01L 24/80 |
| 2020/0176450 A1 | 6/2020 | Yamazaki et al. |
| 2020/0286875 A1* | 9/2020 | Nishida ............. H01L 21/76802 |
| 2023/0079244 A1 | 3/2023 | Yamazaki et al. |

OTHER PUBLICATIONS

Written Opinion of the International Search Authority in International application No. PCT/CN2020/138230, mailed on Dec. 22, 2020.

Chinese Office Action issued in corresponding Chinese Patent Application No. 202011474913.9 dated Jan. 19, 2022, pp. 1-8.

\* cited by examiner

SEMICONDUCTOR DEVICES AND PREPARATION METHODS THEREFOR

CROSS-REFERENCE TO RELATED APPLICATION

This application claims priority to Chinese Patent Application No. 202011474913.9, filed in the China National Intellectual Property Administration on Dec. 14, 2020, entitled "SEMICONDUCTOR DEVICES AND PREPARATION METHODS THEREFOR", the disclosure of which is incorporated herein by reference in its entirety.

TECHNICAL FIELD

The present disclosure relates to a technical field of semiconductor, and in particular to a semiconductor device for a memory and a manufacturing method of the same.

BACKGROUND

A NOR-type flash memory is a memory commonly used in the market. In the NOR-type flash memory chip composed of a memory chip, a memory array is typically arranged in the memory chip. A word line decoder (X-DEC) and a bit line decoder (or "bit line multiplexer" (Y-MUX)) are arranged at the periphery of the memory array to locate a plurality of memory cells in the memory array for further read and write operations on the memory cells. Also, the memory array is typically divided into a plurality of array blocks, each of the array blocks includes a plurality of word lines extending in a first horizontal direction and a plurality of bit lines extending in a second horizontal direction. A local word line decoder is provided at a side of the word line of the array block in the extension direction, and a local bit line decoder and a global bit line decoder are provided at an end of the bit line of the array block in the extension direction. The plurality of bit lines and the plurality of word lines each correspond in parallel to the respective control outputs of the bit line decoder and the word line decoder, to maintain an orderly wiring layout of the connection lines between the word line decoder and respective word lines, and between the bit line decoder and respective bit lines.

SUMMARY

Technical Problem

However, this layout design in which a memory array, and a word line decoder and a bit line decoder at periphery thereof are arranged occupies a large planar area. With the requirements of various applications for small volume, such designs have not met the demand of the times. Therefore, there is a need to develop a NOR-type flash memory chip that may make the overall volume smaller.

Technical Solution

The present disclosure provides a semiconductor device and a method of manufacturing the same, and more particularly, a memory chip and a method of manufacturing the same, which effectively solve the problem that each device in the semiconductor device occupies an excessive planar area.

To solve the above problems, the present disclosure provides a semiconductor device including:

a first chip provided with a memory array including at least one array block, each of the at least one array block including a plurality of word lines extending in a first horizontal direction and a plurality of bit lines extending in a second horizontal direction; and a second chip vertically stacked on the first chip, an electrical connection being formed between the first chip and the second chip, and the second chip including a local word line decoder and a local bit line decoder for controlling a corresponding one array block of the at least one array block through the electrical connection, a block of the second chip provided with the local word line decoder being a local word line decoder block, and a block of the second chip provided with the local bit line decoder being a local bit line decoder block;

the electrical connection between the first chip and the second chip is formed by a bonding structure, and the bonding structure includes a first bonding layer on the first chip and a second bonding layer on the second chip;

At least one of the local word line decoder block and the local bit line decoder block is arranged within a top-down projection region of the corresponding one array block projected onto the second chip, the top-down projection region has a first length in the first horizontal direction and a first width in the second horizontal direction, the local bit line decoder block has a length in the first horizontal direction that is less than or equal to the first length, and the local word line decoder block has a width in the second horizontal direction that is less than or equal to the first width.

Further preferably, the local bit line decoder block includes two sub-local bit line decoder blocks, and the two sub-local bit line decoder blocks are both disposed within two edges of the top-down projection region in the second horizontal direction.

Further preferably, the local word line decoder block is disposed within at least one edge of the top-down projection region in the first horizontal direction.

Further preferably, the length of the local bit line decoder block in the first horizontal direction is equal to the first length, the local bit line decoder block includes two sub-local bit line decoder blocks, the two sub-local bit line decoder blocks are both disposed within two edges of the top-down projection region in the second horizontal direction, the local word line decoder block is located between the two sub-local bit line decoder blocks in the top-down projection region, and a sum of widths of the two sub-local bit line decoder blocks and the local word line decoder block in the second horizontal direction is less than or equal to the first width.

Further preferably, the local word line decoder block includes two sub-local word line decoder blocks, the two sub-local word line decoder blocks are arranged side by side at one side of the top-down projection region in the first horizontal direction, and the two sub-local word line decoder blocks is separated by a connection channel for connecting at least one of the two sub-local word line decoder blocks to the word lines in the corresponding one array block.

Further preferably, the word lines include odd-number-th word lines and even-number-th word lines, the bit lines include odd-number-th bit lines and even-number-th bit lines, the two sub-local word line decoder blocks are connected to the odd-number-th word lines and the even-number-th word lines respectively, and the two sub-local bit line decoder blocks are connected to the odd-number-th bit lines and the even-number-th bit lines respectively.

Further preferably, the connection channel extends in the second horizontal direction, and each of the two sub-local bit line decoder blocks include two secondary sub-local bit line decoder blocks separated by the connection channel.

Further preferably, the corresponding one array block includes two sub-array blocks, the two sub-array blocks are located at both sides in the first horizontal direction of a corresponding channel region downward projected onto the first chip from the connection channel respectively, and both the local word line decoder block and the local bit line decoder block are arranged within a top-down projection region of the two sub-array blocks in the second chip.

To solve the above problems, the present disclosure provides a semiconductor device including:
- a first chip provided with a memory array including at least one array block, each of the at least one array block includes a plurality of word lines extending in a first horizontal direction and a plurality of bit lines extending in a second horizontal direction; and
- a second chip vertically stacked on the first chip, an electrical connection being formed between the first chip and the second chip, and the second chip including a local word line decoder and a local bit line decoder for controlling a corresponding one array block of the at least one array block through the electrical connection, a block of the second chip provided with the local word line decoder is a local word line decoder block, and a block of the second chip provided with the local bit line decoder is a local bit line decoder block, and
- at least one of the local word line decoder block and the local bit line decoder block is arranged within a top-down projection region of the corresponding one array block projected onto the second chip.

Further preferably, the top-down projection region of the corresponding one array block has a first length in the first horizontal direction and a first width in the second horizontal direction, the local bit line decoder block includes two sub-local bit line decoder blocks, are both disposed within two edges of the top-down projection region in the second horizontal direction, and each of the two sub-local bit line decoder blocks has a length in the first horizontal direction that is less than or equal to the first length.

Further preferably, the top-down projection region of the corresponding one array block has a first length in the first horizontal direction and a first width in the second horizontal direction, the local word line decoder block is arranged within at least one edge of the top-down projection region in the first horizontal direction and has a width in the second horizontal direction that is less than or equal to the first width.

Further preferably, the top-down projection region of the corresponding one array block has a first length in the first horizontal direction and a first width in the second horizontal direction, the local bit line decoder block has a length in the first horizontal direction that is equal to the first length, the local bit line decoder block includes two sub-local bit line decoder blocks, the two sub-local bit line decoder blocks are both arranged within two edges of the top-down projection region in the second horizontal direction, the local word line decoder block is located between the two sub-local bit line decoder blocks in the top-down projection region, and a sum of widths of the two sub-local bit line decoder blocks and the local word line decoder block in the second horizontal direction is less than or equal to the first width.

Further preferably, the local word line decoder block includes two sub-local word line decoder blocks, the two sub-local word line decoder blocks are arranged side by side at one side of the top-down projection region in the first horizontal direction, and the two sub-local word line decoder blocks are separated by a connection channel for connecting at least one of the two sub-local word line decoder blocks to the word lines in the corresponding one array block.

Further preferably, the word lines include odd-number-th word lines and even-number-th word lines, the bit lines includes odd-number-th bit lines and even-number-th bit lines, the two sub-local word line decoder blocks are connected to the odd-number-th word lines and the even-number-th word lines respectively, and the two sub-local bit line decoder blocks are connected to the odd-number-th bit lines and the even-number-th bit lines respectively.

Further preferably, the connection channel extends in the second horizontal direction, and each of the two sub-local bit line decoder blocks includes two secondary sub-local bit line decoder blocks separated by the connection channel.

Further preferably, the corresponding one array block includes two sub- array blocks, the two sub-array blocks are located at both sides in the first horizontal direction of a corresponding channel region downward projected onto the first chip from the connection channel respectively, and both the local word line decoder block and the local bit line decoder block are arranged within a top-down projection region of the two sub-array blocks in the second chip.

Further preferably, the electrical connection between the first chip and the second chip is formed by a bonding structure, and the bonding structure includes a first bonding layer on the first chip and a second bonding layer on the second chip.

In another aspect, the present disclosure also provides a method of manufacturing a semiconductor device, the method includes:
- providing a first chip provided with a memory array including at least one array block, each of the at least one array block includes a plurality of word lines extending in a first horizontal direction and a plurality of bit lines extending in a second horizontal direction; and
- providing a second chip provided with a local word line decoder and a local bit line decoder for controlling a corresponding one array block of the at least one array block through an electrical connection, a block of the second chip provided with the local word line decoder being a local word line decoder block, and a block of the second chip provided with the local bit line decoder being a local bit line decoder block, and at least one of the local word line decoder block and the local bit line decoder block being arranged within a top-down projection region of the corresponding one array block projected onto the second chip after the second chip is vertically stacked on the first chip and the electrical connection is formed between the first chip and the second chip.

Further preferably, the method further includes:
forming a first bonding layer on the first chip;
forming a second bonding layer on the second chip;
stacking the second chip on the first chip, and forming the electrical connection through a bonding structure formed by the first bonding layer and the second bonding layer.

Beneficial Effect

According to the present disclosure described above, a local word line decoder and a local bit line decoder for controlling an array block are disposed in the second chip, and the second chip is stacked on the first chip and forms an electrical connection with the first chip; and at least one of the local word line decoder block and the local bit line decoder block formed by the local word line decoder and the local bit line decoder is arranged in the top-down projection region of the array block in the second chip, so that the planar area occupied by the memory chips may be reduced.

Further, the length of the local bit line decoder block in the first horizontal direction is less than or equal to the first length, the local bit line decoder block includes two sub-local bit line decoder blocks, and the two sub-local bit line decoder blocks are respectively arranged within two edges of the above projection region in the second horizontal direction; and the local word line decoder block is located between the two sub-local bit line decoder blocks in the top-down projection region, and a sum of widths of the two sub-local bit line decoder blocks and the local word line decoder block in the second horizontal direction is less than or equal to the first width. The present disclosure enables the local word line decoder and the local bit line decoder associated with each array block in the first chip and the second chip to be located in the top-down projection region of each array block, and enables the connection flatness between the word line decoder and the bit line decoder, and the word lines and the bit lines in the array block to be maintained.

BRIEF DESCRIPTION OF THE DRAWINGS

In order that the technical solution in the embodiments of the present disclosure may be described more clearly, reference will now be made to the accompanying drawings which are to be used in the description of the embodiments, and it is apparent that the drawings in the following description are only some embodiments of the present disclosure. For those skilled in the art, without paying any creative work, other drawings may be obtained based on these drawings.

DETAILED DESCRIPTION

Figure 1:
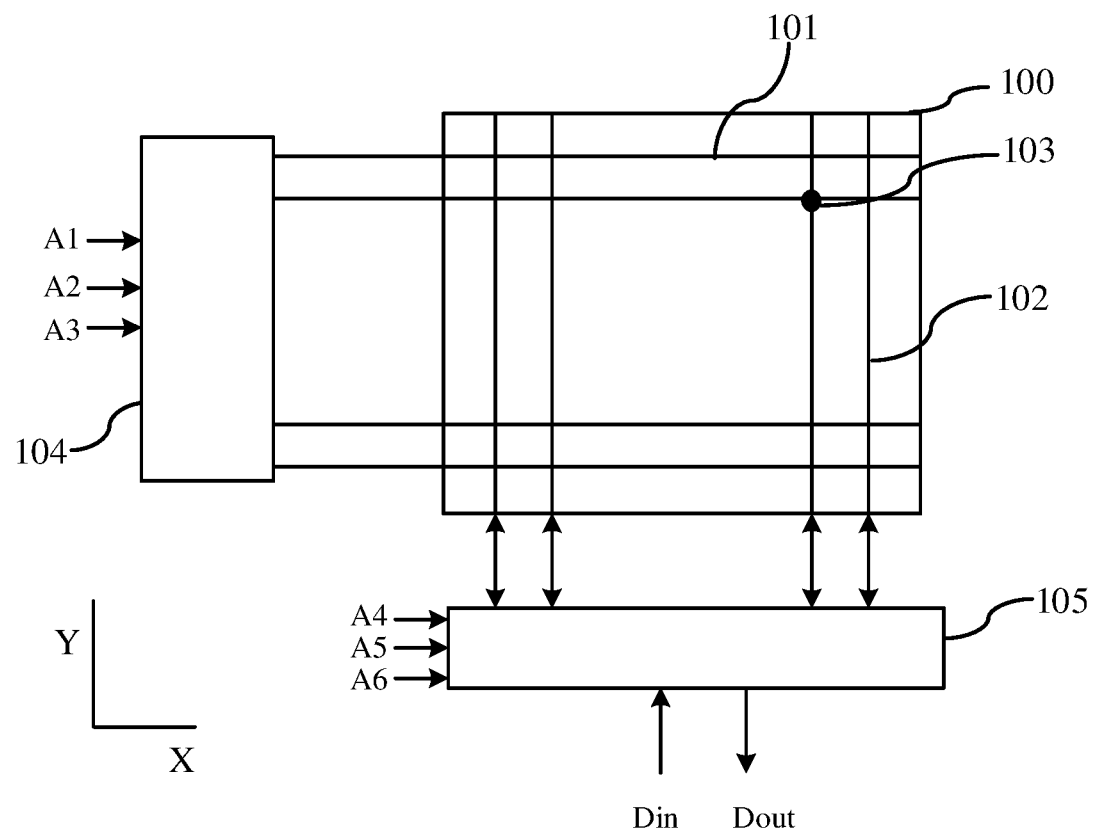
FIG. 1 is a schematic view of a circuit architecture of a NOR-type memory chip in the related art.

The embodiments of the present disclosure are described in detail below. Examples of the embodiments are shown in the drawings, in which the same or similar reference numerals indicate the same or similar components or components having the same or similar functions throughout. The embodiments described below with reference to the accompanying drawings are exemplary and are intended to be illustrative only and are not to be construed as limiting the disclosure.

In the description of this disclosure, it should be understood that the term "first", "second" are for illustrative purposes only and are not to be construed as indicating or imposing a relative importance or implicitly indicating the number of technical features indicated. Thus, a feature that limited by "first", "second" may expressly or implicitly include at least one of the features. In the description of the present disclosure, the meaning of "a plurality of" is two or more, unless otherwise specifically defined. In addition, the terms "first" and "second" are used to distinguish a plurality of components from each other.

The present disclosure is directed to a conventional semiconductor device, and in particular to a problem that a planar area occupied by a conventional NOR-type memory chip is excessively large, and a solution in which the planar area may be reduced and a wiring layout may be kept smooth and orderly is provided.

First, referring to FIG. 1, FIG. 1 is a circuit architecture view of a NOR-type memory chip in the related art. As shown in FIG. 1, a NOR-type memory chip may generally include at least one array block 100 located in a memory array, each of the memory array blocks 100 includes a plurality of word lines 101 extending in a first direction X, a plurality of bit lines 102 extending in a second direction Y, and a plurality of memory cells 103 located at crossing points of the word lines 101 and the bit lines 102. At the periphery of the array block 100, a local word line decoder 104 and a local bit line decoder 105 are provided, and receive respective external address signals A1~A6 for performing data writing Din and data reading Dout.

Figure 2:
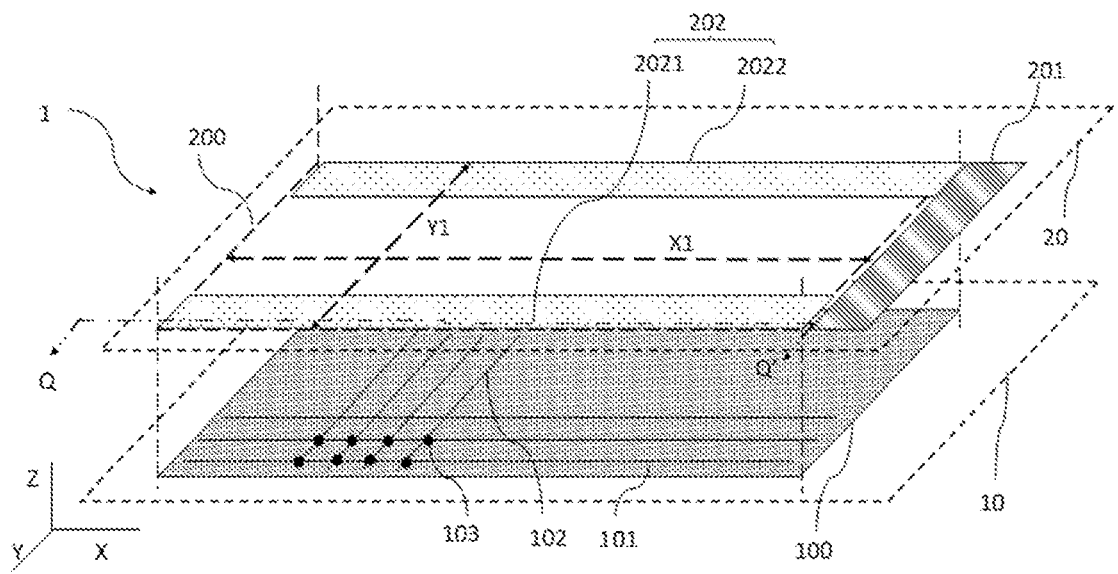
FIG. 2 is a perspective architecture view of a semiconductor device according to a first embodiment of the present disclosure.
Figure 5:
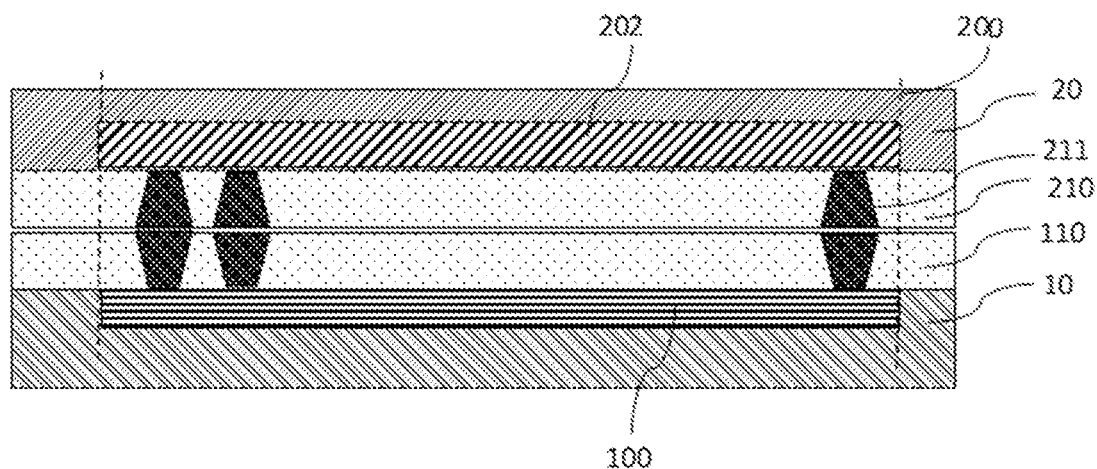
FIG. 5 is a schematic cross-sectional view of a semiconductor device taken along a line Q-Q' shown in FIG. 2 according to an embodiment of the present disclosure.

Next, referring to FIGS. 2 and 5, FIG. 2 is a perspective architecture view of a semiconductor device according to a first embodiment of the present disclosure, and FIG. 5 is a schematic cross-sectional view of a semiconductor device 1 taken along a line Q-Q' shown in FIG. 2 according to an embodiment of the present disclosure. From FIGS. 2 and 5, components and relative positional relationships of the components of the semiconductor device 1 according to the first embodiment of the present disclosure may be intuitively observed.

As shown in FIGS. 2 and 5, the semiconductor device 1 according to the present embodiment includes a first chip 10 and a second chip 20. A memory array including at least one array block 100 is formed in the first chip 10. Each of the array blocks 100 includes a plurality of word lines 101 extending along a first horizontal direction X, a plurality of bit lines 102 extending along a second horizontal direction Y, and a plurality of memory cells 103 located at the intersections of the word lines 101 and the bit lines 102. In FIG. 2, in order to reduce the complexity of the illustration, a plurality of array blocks 100 forming a memory array are not shown, but only one array block 100 is represented, and the word lines 101, the bit lines 102 and the memory cells 103 in the array block 100 are also only shown a few lines and a few cells as an example.

The second chip 20 is vertically stacked on the first chip 10, forms an electrical connection with the first chip 10, and is provided with a local word line decoder (not shown) and a local bit line decoder (not shown) for controlling one array block 100 through the electrical connection. The local word line decoder and the local bit line decoder form a local word line decoder block 201 and a local bit line decoder block 202, respectively, and the local bit line decoder block 202 is disposed within a top-down projection region 200 of the array block 100 in the second chip 20.

In a preferred embodiment, as shown in FIG. 5, a first bonding layer 110 and a second bonding layer 210 are formed on the first chip 10 and the second chip 20, respectively. In the first bonding layer 110 and the second bonding layer 210, a plurality of bonding pads 211 serving as contact points are respectively formed at appropriate positions according to a circuit layout design, and the bonding pads 211 are respectively connected to wires on the first chip 10 and the second chip 20, which are properly connected to the array block 100, the local word line decoder and the local bit line decoder. Only a few bonding pads 211 are shown in FIG. 5 as an example, and in practice the number of the bonding pads 211 may be appropriately set according to actual requirements, and the shape thereof may be a Damascus shape. The first bonding layer 110 and the second bonding layer 210 constitute a bonding structure. The first chip 10 and the second chip 20 are connected by bonding pads 211 in the bonding structure, so that the local word line decoder and the local bit line decoder of the second chip 20 may control the memory cells 103 in the array block 100 on the first chip 10. The materials of the first bonding layer 110 and the second bonding layer 210 are preferably made of an insulating material, such as silicon nitride, silicon oxide, and a doped material of silicon nitride or a doped material of silicon oxide. The material of the bond pad 211 is preferably copper, tungsten or other conductive metal.

Further, as shown in FIG. 2, in the first embodiment, the array block 100 has a top-down projection region 200 in the longitudinal direction of the Z direction, as illustrated in a three-dimensional coordinate consisting of the X-Y-Z axis. The top-down projection region 200 has a first length X1 in the first horizontal direction X and a first width Y1 in the second horizontal direction Y. The local bit line decoder block 202 includes two sub-local bit line decoder blocks 2021, 2022, which are arranged within two edges (preferably close to the two edges) of the top-down projection region 200 in the second horizontal direction Y, respectively, and each of which has a length in the first horizontal direction X that is less than or equal to the first length X1, preferably equal to the first length X1. The local word line decoder block 201 is arranged outside (preferably close to) at least one edge of the top-down projection region 200 in the first horizontal direction X, and has a width in the second horizontal direction Y that is less than or equal to the first width Y1, preferably equal to the first width Y1. The location of the local bit line decoder block 202 and the top-down projection region 200 are also shown in FIG. 5.

According to the arrangement of the first embodiment described above, since the first chip 10 does not need to be provided with a local bit line decoder, and the local bit line decoder block 202 is provided in the top-down projection region 200 of the array block 100 in the second chip 20, the area of the first chip 10 for configuring the circuit in the second horizontal direction Y may be reduced. The position of the local bit line decoder block 202 in the second chip 20 in the second horizontal direction Y may also be within the top-down projection region 200 of the array block 100 of the first chip 10, that is, the orthographic projection of the logic circuit falls within the single array block 100, so that the sizes of both chips in the second horizontal direction Y may be reduced. Since the local bit line decoder block 202 is directly connected downward to the bit lines 102 in the array block 100 through the bonding structure, the routing layout between the two chips may be arranged in a smooth and orderly arrangement in the metal layer of the two chips, without clutter and interleaving, and the size occupied by the circuit in the second horizontal direction Y is not increased, thereby achieving the purpose of reducing the plane size of the entire semiconductor device.

Figure 3:
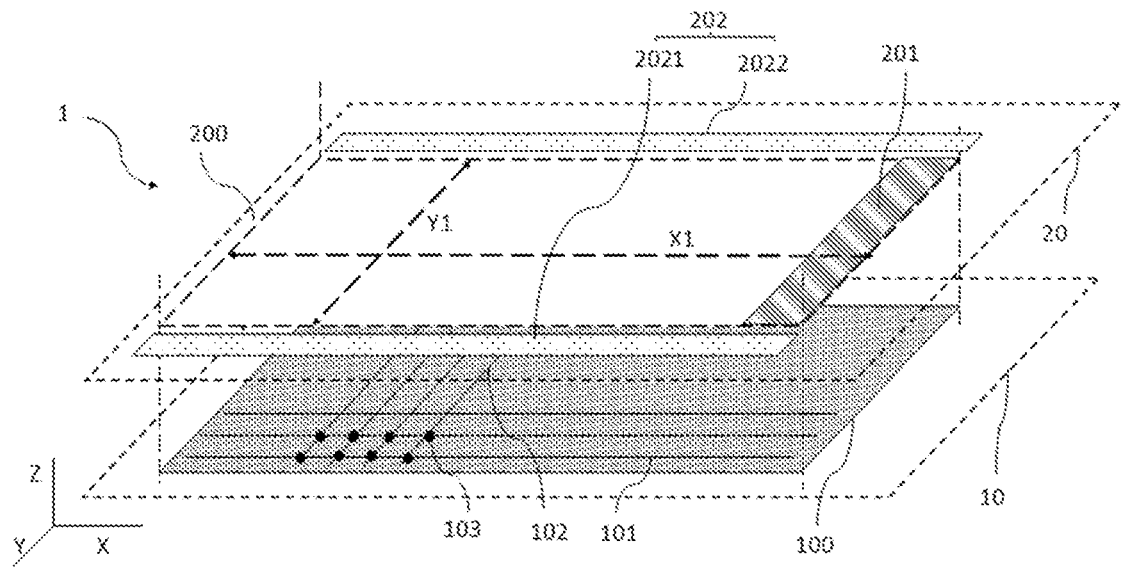
FIG. 3 is a schematic perspective architecture view of a semiconductor device according to a second embodiment of the present disclosure.

Hereinafter, a semiconductor device according to a second embodiment of the present disclosure will be described with reference to FIG. 3. Further, in order to reduce confusion, the same devices and portions as those in the first embodiment shown in FIG. 2 are denoted by the same reference numerals. As shown in FIG. 3, the semiconductor device 1 according to the present embodiment also includes a first chip 10 and a second chip 20. A memory array including at least one array block 100 is formed in the first chip 10. Each of the array blocks 100 includes a plurality of word lines 101 extending along a first horizontal direction X, a plurality of bit lines 102 extending along a second horizontal direction Y, and a plurality of memory cells 103 located at crossing points of the word lines 101 and the bit lines 102.

The second chip 20 is stacked on the first chip 10, forms an electrical connection with the first chip 10, and is provided with a local word line decoder (not shown) and a local bit line decoder (not shown) for controlling one array block 100 through the electrical connection. The local word line decoder and the local bit line decoder form a local word line decoder block 201 and a local bit line decoder block 202, respectively, and the local word line decoder block 201 is disposed within a top-down projection region 200 of the array block 100 in the second chip 20. The first chip 10 and the second chip 20 are also electrically connected by the aforementioned bonding structure, which may refer to the foregoing, and is not described again.

Further, as shown in FIG. 3, the second embodiment differs from the first embodiment in that the local word line decoder block 201 is arranged within the top-down projection region 200 of the array block 100, thereby reducing the size in the first horizontal direction X. The local bit line decoder block 202 also includes two sub-local bit line decoder blocks 2021, 2022, which are arranged outside the two edges of the top-down projection region 200 in the second horizontal direction Y respectively, so that the respective outputs of the local word line decoder block 201 may be aligned smoothly and orderly with the word lines 101 in the array block 100 below.

Specifically, as shown in FIG. 3, the top-down projection region 200 of the array block 100 has a first length X1 in the first horizontal direction X and a first width Y1 in the second horizontal direction Y. The local word line decoder block 201 is arranged within at least one edge (preferably close to the edge) of the top-down projection region 200 in the first horizontal direction X, and has a width in the second horizontal direction Y that is less than or equal to the first width Y1, preferably equal to the first width Y1. The local bit line decoder block 202 includes two sub-local bit line decoder blocks 2021, 2022, each of which has a length in the first horizontal direction X that is less than or equal to the first length X1, preferably equal to the first length X1. In the present embodiment, the two sub-local bit line decoder blocks 2021, 2022 are arranged outside (preferably close to) the two edges of the top-down projection region 200 in the second horizontal direction Y, and have a length in the first horizontal direction X that is less than or equal to the first length X1, preferably equal to the first length X1.

With the arrangement of the second embodiment described above, since the first chip 10 does not need to be provided with the local word line decoder, and the local word line decoder block 201 is provided within the top-down projection region 200 of the array block 100 in the second chip 20, the area of the first chip 10 for configuring a circuit in the first horizontal direction X may be reduced. The position occupied by the local word line decoder block 201 in the second chip 20 in the first horizontal direction X may also be within the top-down projection region 200 of the array block 100 of the first chip 10, that is, the orthographic projection of the logic circuit is located within the single array block 100, so that the sizes of both chips in the first horizontal direction X may be reduced. Since the local word line decoder block 201 is directly connected downward to the word line 101 in the array block 100 through the bonding structure, the routing layout between the two chips may be arranged in a smooth and orderly arrangement in the metal layer of the two chips, without clutter and interleaving, and the size occupied by the circuit in the first horizontal direction X is not increased, thereby achieving the purpose of reducing the plane size of the entire semiconductor device.

Figure 4:
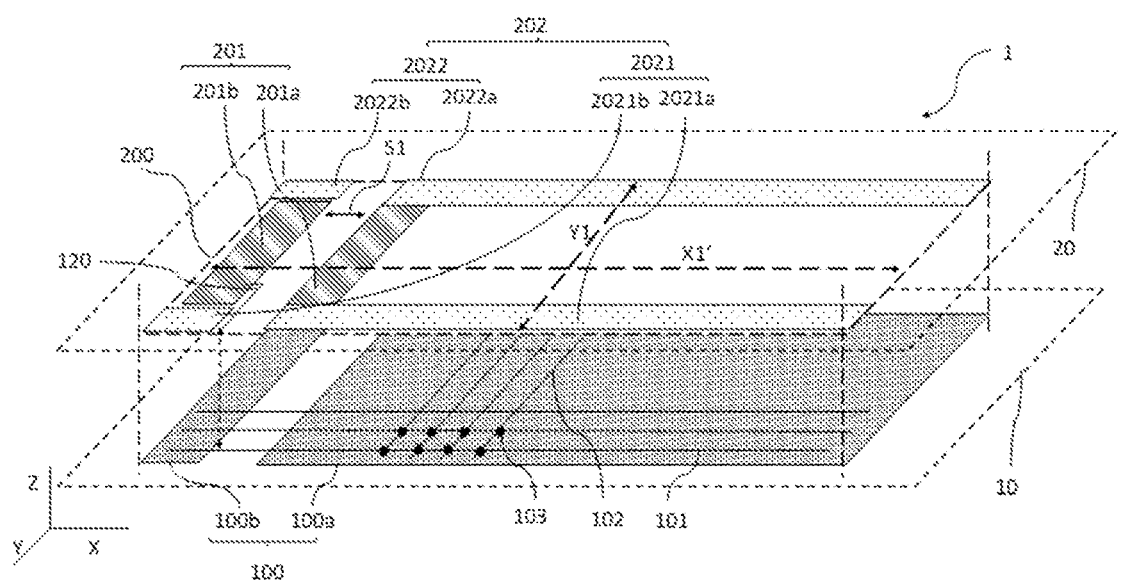
FIG. 4 is a schematic perspective architecture view of a semiconductor device according to a third embodiment of the present disclosure.

Hereinafter, a semiconductor device according to a third embodiment of the present disclosure will be described with reference to FIG. 4. Also, in order to reduce confusion, the same devices and portions as those in the first embodiment shown in FIG. 2 are denoted by the same reference numerals. As shown in FIG. 4, the semiconductor device 1 according to the present embodiment also includes a first chip 10 and a second chip 20. A memory array including at least one array block 100 is formed in the first chip 10. Each array block 100 includes a plurality of word lines 101 extending along a first horizontal direction X, a plurality of bit lines 102 extending along a second horizontal direction Y, and a plurality of memory cells 103 located at crossing points of the word lines 101 and the bit lines 102.

The second chip 20 is stacked on the first chip 10 in the longitudinal direction Z, forms an electrical connection with the first chip 10, and is provided with a local word line decoder and a local bit line decoder for controlling an array block 100 through the electrical connection. The local word line decoder and the local bit line decoder are disposed in a local word line decoder block 201 and a local bit line decoder block 202, respectively, and the local word line decoder block 201 is disposed within a top-down projection region 200 of the array block 100 in the second chip 20. The first chip 10 and the second chip 20 are also electrically connected by the aforementioned bonding structure, which may refer to the foregoing, and is not described again.

Further, as shown in FIG. 4, the third embodiment differs from the first embodiment in that the local word line decoder block 201 and the local bit line decoder block 202 are arranged within the top-down projection region 200 of the array block 100, thereby reducing the plane area occupied by the integrated circuit in both the first horizontal direction X and the second horizontal direction Y, reducing the size of the chip, and making the plane area occupied by the upper chip and the plane area occupied by the lower chip substantially equal, which is conducive to the bonding connection of the two chips.

Specifically, as shown in FIG. 4, the top-down projection region 200 of the array block 100 has a first length X1' in the first horizontal direction X and a first width Y1 in the second horizontal direction Y. The length of the local bit line decoder block 202 in the first horizontal direction X is less than or equal to the first length X1', preferably equal to the first length X1'. The local bit line decoder block 202 includes two sub-local bit line decoder blocks 2021, 2022, which are respectively arranged within two edges (preferably close to the two edges) of the top-down projection region 200 in the second horizontal direction Y. The local word line decoder block 201 is located between the two sub-local bit line decoder blocks 2021, 2022 within the top-down projection region 200, and the sum of the widths of the local word line decoder block 201 and the two sub-local bit line decoder blocks 2021 and 2022 in the second horizontal direction Y is less than or equal to the first width Y1, preferably equal to the first width Y1.

Further preferably, since both the local word line decoder block 201 and the local bit line decoder block 202 are located within the top-down projection region 200, a portion of the output ends of the local word line decoder block 201 may not be aligned smoothly and orderly with the word lines 101 below the local bit line decoder block 202. Therefore, in this third embodiment, a connection channel S1 is provided, the local word line decoder block 201 is also divided into two sub-local word line decoder blocks 201a and 201b, which are arranged side by side at both sides of the connection channel S1, and the output ends of at least one of the sub-local word line decoder blocks may be connected to the corresponding word lines 101 in the first chip 10, which are located below the local word line decoder block 201, in a smooth and orderly arrangement through wiring in the connection channel S1.

Specifically, as shown in FIG. 4, the local word line decoder block 201 includes two sub-local word line decoder blocks 201a and 201b, which are arranged side by side at one side of the top-down projection region 200 in the first horizontal direction X. The two sub-local word line decoder blocks 201a and 201b are separated by the connection channel S1. The connection channel S1 is used for connecting at least one of the two sub-local word line decoder blocks 201a and 201b to the corresponding word lines 101 in the array block 100. As shown in FIG. 4, one of the two sub-local word line decoder blocks, that is, the two sub-local word line decoder block 201b is connected to the lower corresponding word line 101 through a connection line 120 arranged in the connection channel S1 and the bonding pad 211 among the bonding structure described above. The number of the connection lines 120 and the bond pads 211 is determined as desired.

Further preferably, the word lines 101 includes an odd-number word line and an even-number word line, and the bit line 102 includes an odd-number bit line and an even-number bit line. The two sub-local word line decoder blocks 201a and 201b correspond to control of the odd-number word line and the even-number word line, respectively, and the two sub-local bit line decoder blocks 2021 and 2022 correspond to control of the odd-number bit line and the even-number bit line, respectively.

It is still further preferable that, due to the arrangement of the connection channel S1, in order to align the arrangement positions of the top-down projection region 200, and the local word line decoder block 201 and the local bit line decoder block 202 to achieve a plane area of the same size, the connection channel S1 extends in the second horizontal direction Y. Each of the two sub-local bit line decoder blocks 2021 and 2022 include two secondary sub-local bit line decoder blocks separated by the connection path S1, which are 2021a and 2021b, and 2022a and 2022b, respectively.

At the same time, the array block 100 also includes two sub-array blocks 100a and 100b, which are separated by a corresponding channel region downward projected on the first chip 10 from the connection channel S1 and are located at both sides of the corresponding channel region in the first horizontal direction X, so that both the local word line decoder block 201 and the local bit line decoder block 202 are disposed in the top-down projection region 200 of the two sub-array blocks 100a and 100b in the second chip 20. Specifically, the word lines 101 are still connected between the two sub-array blocks 100a and 100b, but the bit lines 102 are separated by the connection channel S1 and located in the two sub-array blocks 100a and 100b.

With the arrangement of the third embodiment described above, since the first chip 10 does not need to be provided with the local word line decoder and the local bit line decoder, and both the local word line decoder block 201 and the local bit line decoder block 202 are provided within the top-down projection region 200 of the array block 100 in the second chip 20, the sizes of the first chip 10 in the first horizontal direction X and the second horizontal direction Y may be reduced. In addition, the sizes of the second chip 20 in the first horizontal direction X and the second horizontal direction Y may be set to be the same as the first chip 10, the orthographic projection of the logic circuits such as the local word line decoder block 201 and the local bit line decoder block 202 is located within the single array block 100, and therefore, the sizes of both chips may be reduced. Since the bonding structure is used for connection, the routing layout between the two chips may be relatively smooth and orderly. Further, since the local word line decoder block 201 and the local bit line decoder block 202 are provided at the edges of the array block 100, the local word line decoder block 201 and the local bit line decoder block 202 may be connected to the word lines and the bit lines at a shortest distance respectively, thereby reducing circuit loss. Wherein, although the connection channel S1 is provided, the area occupied by the connection channel S1 is relatively small with respect to the size of the entire array block, so that both the first and second chips may be reduced in size and matched in size in the first horizontal direction X and the second horizontal direction Y, and the connection wires between the first and second chips may be kept smooth and orderly and at a minimum connection distance.

In combination with the above three embodiments, the present disclosure may be summarized to disclose a semiconductor device including: a first chip provided with a memory array including at least one array block, which includes a plurality of word lines extending in a first horizontal direction and a plurality of bit lines extending in a second horizontal direction; and a second chip vertically stacked on the first chip and forming an electrical connection with the first chip, the second chip is provided with a local word line decoder and a local bit line decoder for controlling one array block through the electrical connection, and the local word line decoder and the local bit line decoder form a local word line decoder block and a local bit line decoder block, respectively; at least one of the local word line decoder block and the local bit line decoder block is disposed within a top-down projection region of the array block in the second chip.

Figure 6:
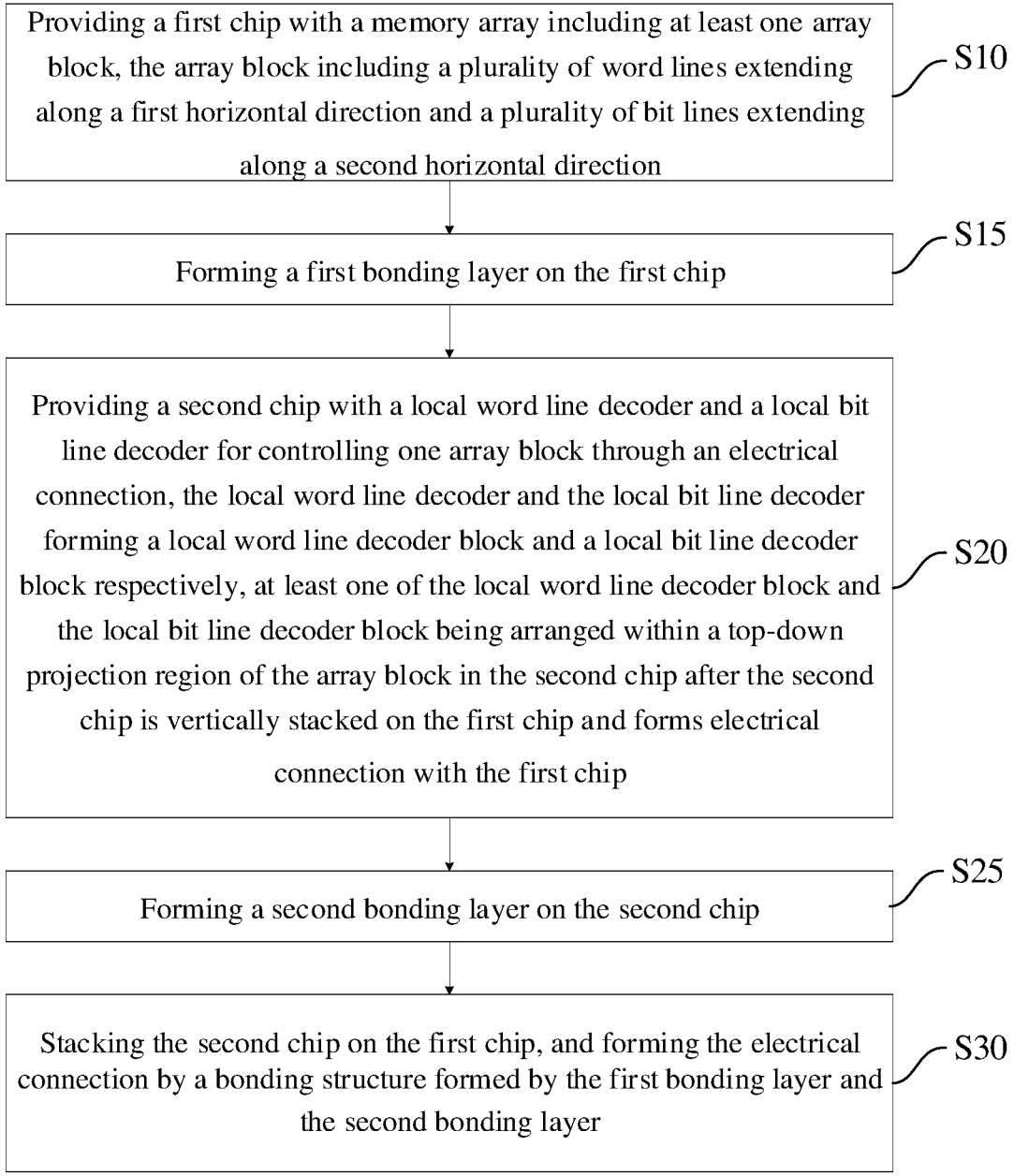
FIG. 6 is a schematic flow diagram of a manufacturing method of a semiconductor device according to an embodiment of the present disclosure.

Further, according to the embodiments described above, the present disclosure simultaneously discloses a manufacturing method of a semiconductor device according to an embodiment of the present disclosure, as shown in FIG. 6, which may refer to the structure views of the semiconductor device shown in FIGS. 2 to 5.

The manufacturing method mainly includes following steps.

At step S10, a first chip 10 is provided, the first chip 10 is provided with a memory array including at least one array block 100, the array block 100 includes a plurality of word lines 101 extending along a first horizontal direction X and a plurality of bit lines 102 extending along a second horizontal direction Y.

At step S20, a second chip 20 is provided, the second chip 20 is provided with a local word line decoder and a local bit line decoder for controlling an array block 100 through an electrical connection, and the local word line decoder and the local bit line decoder form a local word line decoder block 201 and a local bit line decoder block 202, respectively; at least one of the local word line decoder block 201 and the local bit line decoder block 202 is disposed within a top-down projection region 200 of the array block 100 in the second chip 20 after the second chip 20 is vertically stacked on the first chip 10 and forms electrical connection with the first chip 10.

Preferably, the manufacturing method further includes following steps after steps S10 and S20 respectively.

At step S15, a first bonding layer 110 including a plurality of bonding pads 211 is formed on the first chip 10.

At step S25, a second bonding layer 210 including a plurality of bonding pads 211 is formed on the second chip 20.

Finally, at step S30, the second chip 20 is stacked on the first chip 10, and the electrical connection is achieved by a bonding structure formed by the first bonding layer 110 and the second bonding layer 210.

With the above-described manufacturing method, the present disclosure may provide an innovative memory chip, which not only has a reduced planar area, but also enables the wiring between the two chips to be kept smooth and orderly and the transmission of signals to have the best efficiency.

There may be other embodiments of the present disclosure in addition to the above-described embodiments. It will be appreciated by those ordinary skilled in the art that equivalent replacements or changes may be made according to the technical solutions and inventive concepts of the present disclosure, and all such changes or replacements should fall within the protection scope of the claims appended to the present disclosure.

What is claimed is:

1. A semiconductor device, comprising:
   a first chip provided with a memory array comprising at least one array block, each of the at least one array block comprising a plurality of word lines extending in a first horizontal direction and a plurality of bit lines extending in a second horizontal direction; and
   a second chip vertically stacked on the first chip, an electrical connection being formed between the first chip and the second chip, and the second chip comprising a local word line decoder and a local bit line decoder for controlling a corresponding one array block of the at least one array block through the electrical connection, a block of the second chip provided with the local word line decoder being a local word line decoder block, and a block of the second chip provided with the local bit line decoder being a local bit line decoder block, and
   wherein the electrical connection between the first chip and the second chip is formed by a bonding structure, and the bonding structure comprises a first bonding layer on the first chip and a second bonding layer on the second chip;
   at least one of the local word line decoder block and the local bit line decoder block is arranged within a top-down projection region of the corresponding one array block projected onto the second chip, the top-down projection region has a first length in the first horizontal direction and a first width in the second horizontal direction, the local bit line decoder block has a length in the first horizontal direction that is less than or equal to the first length, and the local word line decoder block has a width in the second horizontal direction that is less than or equal to the first width.

2. The semiconductor device according to claim 1, wherein the local bit line decoder block comprises two sub-local bit line decoder blocks, and the two sub-local bit line decoder blocks are both disposed within two edges of the top-down projection region in the second horizontal direction.

3. The semiconductor device according to claim 1, wherein the local word line decoder block is disposed within at least one edge of the top-down projection region in the first horizontal direction.

4. The semiconductor device according to claim 1, wherein the length of the local bit line decoder block in the first horizontal direction is equal to the first length, the local bit line decoder block comprises two sub-local bit line decoder blocks, the two sub-local bit line decoder blocks are both disposed within two edges of the top-down projection region in the second horizontal direction, the local word line decoder block is located between the two sub-local bit line decoder blocks in the top-down projection region, and a sum of widths of the two sub-local bit line decoder blocks and the local word line decoder block in the second horizontal direction is less than or equal to the first width.

5. The semiconductor device according to claim 4, wherein the local word line decoder block comprises two sub-local word line decoder blocks, the two sub-local word line decoder blocks are arranged side by side at one side of the top-down projection region in the first horizontal direction, and the two sub-local word line decoder blocks are separated by a connection channel for connecting at least one of the two sub-local word line decoder blocks to the word lines in the corresponding one array block.

6. The semiconductor device according to claim 5, wherein the word lines comprise odd-number-th word lines and even-number-th word lines, the bit lines comprise odd-number-th bit lines and even-number-th bit lines, the two sub-local word line decoder blocks are connected to the odd-number-th word lines and the even-number-th word lines respectively, and the two sub-local bit line decoder blocks are connected to the odd-number-th bit lines and the even-number-th bit lines respectively.

7. The semiconductor device according to claim 5, wherein the connection channel extends in the second horizontal direction, and each of the two sub-local bit line decoder blocks comprises two secondary sub-local bit line decoder blocks separated by the connection channel.

8. The semiconductor device according to claim 5, wherein the corresponding one array block comprises two sub-array blocks, the two sub-array blocks are located at both sides in the first horizontal direction of a corresponding channel region downward projected onto the first chip from the connection channel respectively, and both the local word line decoder block and the local bit line decoder block are arranged within a top-down projection region of the two sub-array blocks in the second chip.

9. A semiconductor device, comprising:
a first chip provided with a memory array comprising at least one array block, each of the at least one array block comprising a plurality of word lines extending in a first horizontal direction and a plurality of bit lines extending in a second horizontal direction; and
a second chip vertically stacked on the first chip, an electrical connection being formed between the first chip and the second chip, and the second chip comprising a local word line decoder and a local bit line decoder for controlling a corresponding one array block of the at least one array block through the electrical connection, a block of the second chip provided with the local word line decoder being a local word line decoder block, and a block of the second chip provided with the local bit line decoder being a local bit line decoder block, and
wherein at least one of the local word line decoder block and the local bit line decoder block is arranged within a top-down projection region of the corresponding one array block projected onto the second chip.

10. The semiconductor device according to claim 9, wherein the top-down projection region of the corresponding one array block has a first length in the first horizontal direction and a first width in the second horizontal direction, the local bit line decoder block comprises two sub-local bit line decoder blocks, the two sub-local bit line decoder blocks are both disposed within two edges of the top-down projection region in the second horizontal direction, and each of the two sub-local bit line decoder blocks has a length in the first horizontal direction that is less than or equal to the first length.

11. The semiconductor device according to claim 9, wherein the top-down projection region of the corresponding one array block has a first length in the first horizontal direction and a first width in the second horizontal direction, the local word line decoder block is arranged within at least one edge of the top-down projection region in the first horizontal direction and has a width in the second horizontal direction that is less than or equal to the first width.

12. The semiconductor device according to claim 9, wherein the top-down projection region of the corresponding one array block has a first length in the first horizontal direction and a first width in the second horizontal direction, the local bit line decoder block has a length in the first horizontal direction that is equal to the first length, the local bit line decoder block comprises two sub-local bit line decoder blocks, the two sub-local bit line decoder blocks are both arranged within two edges of the top-down projection region in the second horizontal direction, the local word line decoder block is located between the two sub-local bit line decoder blocks in the top-down projection region, and a sum of widths of the two sub-local bit line decoder blocks and the local word line decoder block in the second horizontal direction is less than or equal to the first width.

13. The semiconductor device according to claim 12, wherein the local word line decoder block comprises two sub-local word line decoder blocks, the two sub-local word line decoder blocks are arranged side by side at one side of the top-down projection region in the first horizontal direction, and the two sub-local word line decoder blocks are separated by a connection channel for connecting at least one of the two sub-local word line decoder blocks to the word lines in the corresponding one array block.

14. The semiconductor device according to claim 13, wherein the corresponding one array block comprises two sub-array blocks, the two sub-array blocks are located at both sides in the first horizontal direction of a corresponding channel region downward projected on the first chip from the connection channel respectively, and both the local word line decoder block and the local bit line decoder block are arranged within a top-down projection region of the two sub-array blocks in the second chip.

15. The semiconductor device according to claim 13, wherein the word lines comprise odd-number-th word lines and even-number-th word lines, the bit lines comprises odd-number-th bit lines and even-number-th bit lines, the two sub-local word line decoder blocks are connected to the odd-number-th word lines and the even-number-th word lines respectively, and the two sub-local bit line decoder blocks are connected to the odd-number-th bit lines and the even-number-th bit lines respectively.

16. The semiconductor device according to claim 13, wherein the connection channel extends in the second horizontal direction, and each of the two sub-local bit line decoder blocks comprises two secondary sub-local bit line decoder blocks separated by the connection channel.

17. The semiconductor device according to claim 16, wherein the corresponding one array block comprises two sub-array blocks, the two sub-array blocks are located at both sides in the first horizontal direction of a corresponding channel region downward projected onto the first chip from the connection channel respectively, and both the local word line decoder block and the local bit line decoder block are arranged within a top-down projection region of the two sub-array blocks in the second chip.

18. The semiconductor device according to claim 9, wherein the electrical connection between the first chip and the second chip is formed by a bonding structure, and the bonding structure comprises a first bonding layer on the first chip and a second bonding layer on the second chip.

19. A method of manufacturing a semiconductor device, wherein the manufacturing method comprises:

providing a first chip provided with a memory array comprising at least one array block, each of the at least one array block comprising a plurality of word lines extending in a first horizontal direction and a plurality of bit lines extending in a second horizontal direction; and providing a second chip provided with a local word line decoder and a local bit line decoder for controlling a corresponding one array block of the at least one array block through an electrical connection, a block of the second chip provided with the local word line decoder being a local word line decoder block, and a block of the second chip provided with the local bit line decoder being a local bit line decoder block, and at least one of the local word line decoder block and the local bit line decoder block being arranged within a top-down projection region of the corresponding one array block projected onto the second chip after the second chip is vertically stacked on the first chip and the electrical connection is formed between the first chip and the second chip.

20. The method according to claim 19, further comprising:

forming a first bonding layer on the first chip;
forming a second bonding layer on the second chip;
stacking the second chip on the first chip, and forming the electrical connection through a bonding structure formed by the first bonding layer and the second bonding layer.

* * * * *